United States Patent
Lee et al.

(10) Patent No.: US 7,668,006 B2
(45) Date of Patent: Feb. 23, 2010

(54) MULTI-PORT PHASE CHANGE RANDOM ACCESS MEMORY CELL AND MULTI-PORT PHASE CHANGE RANDOM ACCESS MEMORY DEVICE INCLUDING THE SAME

(75) Inventors: Kwang-jin Lee, Hwaseong-si (KR); Du-eung Kim, Yongin-si (KR); Chang-soo Lee, Hwaseong-si (KR); Qi Wang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 19 days.

(21) Appl. No.: 11/902,704

(22) Filed: Sep. 25, 2007

(65) Prior Publication Data

US 2008/0084736 A1     Apr. 10, 2008

(30) Foreign Application Priority Data

Oct. 4, 2006     (KR) .................. 10-2006-0097601

(51) Int. Cl.
*G11C 11/00* (2006.01)
(52) U.S. Cl. .................. 365/163; 365/148; 365/63
(58) Field of Classification Search .................. 365/163, 365/148, 63, 51, 189.14–189.16
See application file for complete search history.

(56) References Cited

U.S. PATENT DOCUMENTS

| 5,204,841 | A | 4/1993 | Chappell et al. |
| 6,834,024 | B2 * | 12/2004 | Frydel .................. 365/230.05 |
| 7,301,791 | B2 * | 11/2007 | Atwood et al. ............. 365/49.1 |
| 7,411,813 | B2 * | 8/2008 | Maki .......................... 365/154 |
| 7,474,555 | B2 * | 1/2009 | Nirschl et al. ............... 365/163 |
| 2006/0077737 | A1 | 4/2006 | Ooishi |

FOREIGN PATENT DOCUMENTS

| JP | 07-052586 | 6/1995 |
| JP | 2006-031795 | 2/2006 |
| KR | 10-2005-0118332 | 12/2005 |

\* cited by examiner

*Primary Examiner*—David Lam
(74) *Attorney, Agent, or Firm*—Lee & Morse, P.C.

(57) ABSTRACT

A multi-port phase change random access memory (PRAM) cell, includes a PRAM element including a phase change material, a writing controller configured to operate in correspondence with a writing word line, the writing controller connecting a writing bit line to the PRAM element, and a reading controller configured to operate in correspondence with a reading word line, the reading controller connecting the PRAM element to a reading bit line.

24 Claims, 6 Drawing Sheets

MULTI-PORT PHASE CHANGE RANDOM ACCESS MEMORY CELL AND MULTI-PORT PHASE CHANGE RANDOM ACCESS MEMORY DEVICE INCLUDING THE SAME

BACKGROUND OF THE INVENTION

1. Field of the Invention

Embodiments relate to a phase change random access memory (PRAM) and, more particularly, to a multi-port phase change random access memory cell and multi-port phase change random access memory device including the same.

2. Description of the Related Art

A PRAM device may include a plurality of PRAM cells. Generally, a PRAM cell may have a writing speed that is slower than a reading speed. Accordingly, there is a need for a PRAM device that provides an improved read/write access time.

SUMMARY OF THE INVENTION

Embodiments are therefore directed to a multi-port phase change random access memory cell and multi-port phase change random access memory device including the same, which substantially overcome one or more of the problems due to the limitations and disadvantages of the related art.

It is therefore a feature of an embodiment to provide a multi-port phase change random access memory cell having separate reading and writing ports, and multi-port phase change random access memory device including the same.

It is therefore another feature of an embodiment to provide a multi-port phase change random access memory device configured to operate a multi-port phase change random access memory cell having different writing and reading speeds.

At least one of the above and other features and advantages may be realized by providing a multi-port phase change random access memory (PRAM) cell, including a PRAM element including a phase change material, a writing controller configured to operate in correspondence with a writing word line, the writing controller connecting a writing bit line to the PRAM element, and a reading controller configured to operate in correspondence with a reading word line, the reading controller connecting the PRAM element to a reading bit line.

The multi-port PRAM cell may operate in a writing mode, during which data is written to the PRAM element, and a reading mode, during which data is read from the PRAM element, the writing controller may provide a writing current to the PRAM element in the writing mode, and the reading controller may provide a reading current to the PRAM element in a reading mode.

The writing controller may include a writing access transistor, the writing access transistor having a gate connected to the writing word line, a first terminal connected to the writing bit line, and a second terminal connected to the PRAM element, and the reading controller may include a reading access transistor, the reading access transistor having a gate connected to the reading word line, a first terminal connected to the reading bit line, and a second terminal connected to the PRAM element.

At least one of the above and other features and advantages may also be realized by providing a PRAM element including a phase change material, a writing controller configured to operate in correspondence with a writing word line, the writing controller connecting a writing bit line to the PRAM element, a reading controller configured to operate in correspondence with a reading word line, the reading controller connecting the PRAM element to a reading bit line, and a developer configured to provide a developing current to the PRAM element as part of a data read operation.

The developer may be configured to operate in correspondence with the reading word line.

The developer may include a developing transistor having a gate connected to the reading word line.

The developing transistor may have a predetermined turn-on resistance, the predetermined turn-on resistance may be greater than the minimum resistance of the PRAM element, and the predetermined turn-on resistance may be less than the maximum resistance of the PRAM element.

The developer may provide a developing current that is greater than a minimum current required to read data from the PRAM element and less than a current that affects a crystallization state of the PRAM element.

The developer may also provide the developing current to at least one other multi-port PRAM cell.

The multi-port PRAM cell may include a plurality of writing controllers and a plurality of reading controllers, the writing controllers may connect respective writing bit lines to the PRAM element, the writing controllers being configured to operate in correspondence with respective writing word lines, and the reading controllers may connect the PRAM element to respective reading bit lines, the reading controllers being configured to operate in correspondence with respective reading word lines.

The multi-port PRAM cell may further include a plurality of developers, the developers being configured to provide a developing current to the PRAM element as part of a data read operation.

The developers may be configured to operate in correspondence with respective reading word lines.

Each developer may include a developing transistor having a gate connected to a respective reading word line.

Each developing transistor may have a predetermined turn-on resistance, the predetermined turn-on resistance may be greater than the minimum resistance of the PRAM element, and the predetermined turn-on resistance may be less than the maximum resistance of the PRAM element.

Each developer may provide a developing current that is greater than a minimum current required to read data from the PRAM element and less than a current that affects a crystallization state of the PRAM element.

At least one developer may also provide the developing current to an adjacent multi-port PRAM cell.

The multi-port PRAM cell may operate in a writing mode, during which data is written to the PRAM element, and a reading mode, during which data is read from the PRAM element, at least one writing controller may provide a writing current to the PRAM element in the writing mode, and at least one reading controller may provide a reading current to the PRAM element in a reading mode.

Each writing controller may include a writing access transistor, the writing access transistor having a gate connected to a respective writing word line, a first terminal connected to a respective writing bit line, and a second terminal connected to the PRAM element, and each reading controller may include a reading access transistor, the reading access transistor having a gate connected to a respective reading word line, a first terminal connected to a respective reading bit line, and a second terminal connected to the PRAM element.

At least one of the above and other features and advantages may also be realized by providing a phase change random access memory (PRAM) device, including a plurality of multi-port PRAM cells, a data writing unit connected to the plurality of multi-port PRAM cells and configured to write data to the multi-port PRAM cells, and a data reading unit connected to the plurality of multi-port PRAM cells and configured to read data from the multi-port PRAM cells. Each PRAM cell may include a PRAM element including a phase change material, a writing controller configured to operate in correspondence with a writing word line, the writing controller connecting a writing bit line to the PRAM element, and a reading controller configured to operate in correspondence with a reading word line, the reading controller connecting the PRAM element to a reading bit line.

The PRAM device may further include at least one developer configured to provide a developing current to one or more of the plurality of PRAM cells as part of a data read operation.

The multi-port PRAM cell may include a plurality of writing controllers and a plurality of reading controllers, the writing controllers may connect respective writing bit lines to the PRAM element, the writing controllers being configured to operate in correspondence with respective writing word lines, and the reading controllers may connect the PRAM element to respective reading bit lines, the reading controllers being configured to operate in correspondence with respective reading word lines.

BRIEF DESCRIPTION OF THE DRAWINGS

The above and other features and advantages will become more apparent to those of ordinary skill in the art by describing in detail example embodiments with reference to the attached drawings, in which.

DETAILED DESCRIPTION OF THE INVENTION

Figure 1:
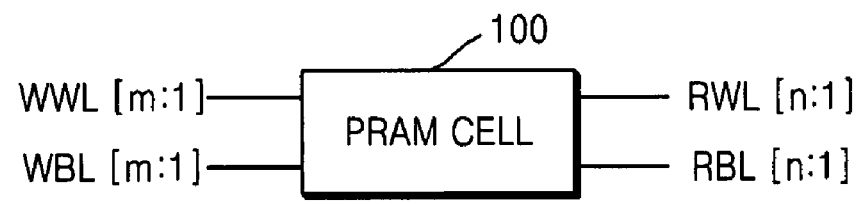
FIG. 1 illustrates a schematic view of a multi-port PRAM cell according to an embodiment.

Korean Patent Application No. 10-2006-0097601, filed on Oct. 4, 2006, in the Korean Intellectual Property Office, and entitled: "Multi-Port Phase Random Access Memory Cell and Multi-Port Phase Random Access Memory Device Including the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

FIG. 1 illustrates a schematic view of a multi-port PRAM cell 100 according to an embodiment.

Referring to FIG. 1, the multi-port PRAM cell 100 may include a PRAM element. The size of the multi-port PRAM cell 100 may be less than that of a similar memory cell in a Dynamic Random Access Memory (DRAM). Moreover, the operational speed of the multi-port PRAM cell 100 may be faster than that of a similar memory cell in a Static Random Access Memory (SRAM).

The multi-port PRAM cell 100 may be included in a phase change random access memory (PRAM) device, which may be a non-volatile memory device that stores data using materials such as a phase change material, in which the resistance depends on a crystalline state. The crystalline state may be changed by a phase transition caused by a temperature change. PRAM devices may change the crystalline state of the phase change material, e.g., from a crystallized to a non-crystallized state, and vice versa, so as to store information. For the phase change of the phase change material to occur, a high temperature of above 900° C. may be required, which may be provided by joule heating as a result of a current flowing through the phase change random access device.

In a writing operation, current may flow through the phase change material so that the phase change material is heated above a melting temperature, after which the phase change material may be quickly cooled, such that the phase change material stores information, e.g., a logical "1," in an amorphous form. This state may be referred to as a reset state. Also, when the phase change material is heated above a crystallization temperature, maintained at a predetermined temperature for a certain period of time, and then cooled down, the phase change material may store information, e.g., a logical "0," in a crystallized state. This state may be referred to as a set state.

In a read operation, a bit line and a word line may be selected so that a specific PRAM cell 100 is selected. A current may flow from an external source to the PRAM cell 100 so as to distinguish between "1" and "0" as a difference in a voltage according to a resistance, i.e., a crystallization state, of a phase change material in the PRAM cell 100.

The multi-port PRAM cell 100 may include m data writing routes and n data reading routes. The multi-port PRAM cell 100 may be connected to m writing word lines WWL [m:1], m writing bit lines RBL [m:1], n reading word lines RWL [n:1], and n reading bit lines RBL [n:1], where m and n are natural numbers. Since a writing port and a reading port may be separately provided, even where the PRAM element has a slower writing speed than a reading speed, it can be optimally used.

Figure 2:
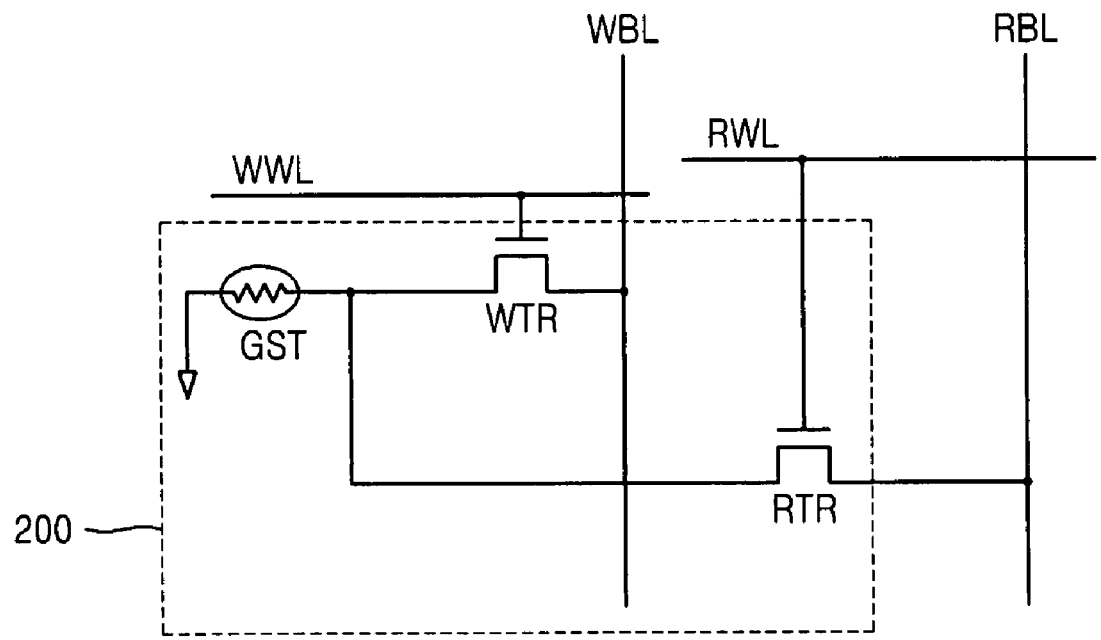
FIG. 2 illustrates a multi-port PRAM cell according to a first embodiment.

FIG. 2 illustrates a multi-port PRAM cell 200 according to a first embodiment.

The multi-port PRAM cell 200 according to the first embodiment may include a data reading route and a data writing route. The multi-port PRAM cell 200 may include a PRAM element GST, which may include a phase change material such as a chalcogenide alloy, e.g. a germanium-antimony tellurium (Ge—Sb—Te (GST)) alloy, etc. The multi-port PRAM cell 200 may further include a writing controller WTR and a reading controller RTR. The writing controller WTR may respond to an activation of a writing word line WWL that is to be operated and may write data provided through a writing bit line WBL to the PRAM element GST. The reading controller RTR may respond to an activation of a reading word line RWL that is to be activated and may output data of the PRAM element GST to a reading bit line RBL.

In a writing mode, during which data is written to the PRAM element GST, the writing controller WTR may provide a writing current to the PRAM element GST. In a reading mode, during which data is read from the PRAM element GST, the reading controller RTR may provide a reading current to the PRAM element GST.

The writing controller WTR may include, e.g., a writing access transistor, in which a gate of the writing controller WTR is connected to the writing word line WWL, a first terminal of the writing controller WTR is connected to the writing bit line WBL, and a second terminal of the writing controller WTR is connected to the PRAM element GST. The reading controller RTR may include a reading access transistor, in which a gate of the reading controller RTR may be connected to the reading word line RWL, a first terminal of the reading controller RTR may be connected to the reading bit line RBL, and a second terminal of the reading controller RTR may be connected to the PRAM element GST.

When the writing word line WWL is activated in the writing mode, the writing controller WTR may be turned on. Then, a writing current, corresponding to a logic level of data that is to be written, may be provided to the PRAM element GST through the writing bit line WBL, and accordingly, data may be written to the PRAM element GST.

When the reading word line RWL is activated in the reading mode, the reading controller RTR may be turned on. Then, a reading current used to read data from the PRAM element GST may be provided to the PRAM element GST through the reading bit line RBL. Accordingly, data stored in the PRAM element GST may be read through the reading bit line RBL.

Figure 3:
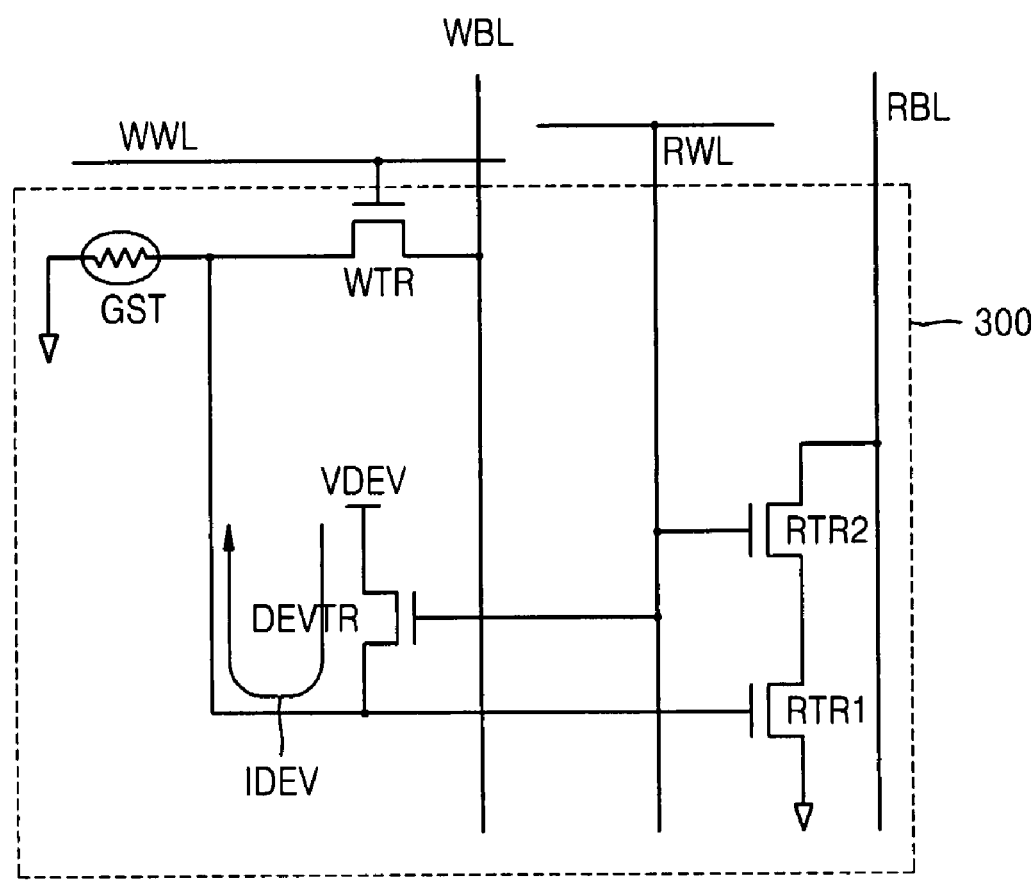
FIG. 3 illustrates a multi-port PRAM cell according to a second embodiment.

FIG. 3 illustrates a multi-port PRAM cell 300 according to a second embodiment.

The multi-port PRAM cell 300 may include a data reading route and a data writing route. The configuration and operation of the multi-port PRAM cell 300 according to the second embodiment may correspond to that of the multi-port PRAM cell 200 illustrated in FIG. 2, except that the multi-port PRAM cell 300 may also include a developer DEVTR. In order to avoid repetition, in the following description only the developer DEVTR will be described in detail.

The multi-port PRAM cell 300 according to the second embodiment may include the PRAM element GST including the phase change material, the writing controller WTR, the reading controller RTR, and the developer DEVTR. The developer DEVTR may provide a developing current IDEV to the PRAM element GST so as to read data from the PRAM element GST.

According to an activation or deactivation of a reading word line RWL, the developer DEVTR may apply or not apply the developing current IDEV to the PRAM element GST. The developer DEVTR may include a developing transistor, which may be turned on or turned off according to the activation or deactivation of the reading word line RWL.

In an implementation, the turn-on resistance of the developing transistor DEVTR may be larger than the minimum resistance of the PRAM element GST and smaller than the maximum resistance of the PRAM element GST.

In an implementation, the developing current IDEV may be larger than the minimum current capacity that can read data from the PRAM element GST and smaller than the current capacity that affects the state of the PRAM element GST.

When the reading word line RWL is activated in a reading mode, a second reading access transistor RTR2 and the developing transistor DEVTR may be turned on. Accordingly, the developing current IDEV may be provided to the PRAM element GST and the data stored in the PRAM element GST may be read through corresponding first reading access transistor RTR1 and a corresponding reading bit line RBL.

The multi-port PRAM cell 200 according to the first embodiment may apply a reading current through the reading bit line RBL to read data from the PRAM element GST. However, the reading current may generally be very small, and thus providing the reading current may be difficult. In the multi-port PRAM cell 300 according to the second embodiment, the developing current IDEV may function as the reading current to the PRAM element GST, and may be provided using the developer DEVTR. Thus, a small reading current, i.e., the developing current IDEV, may be easily provided to the PRAM element GST.

Figure 4:
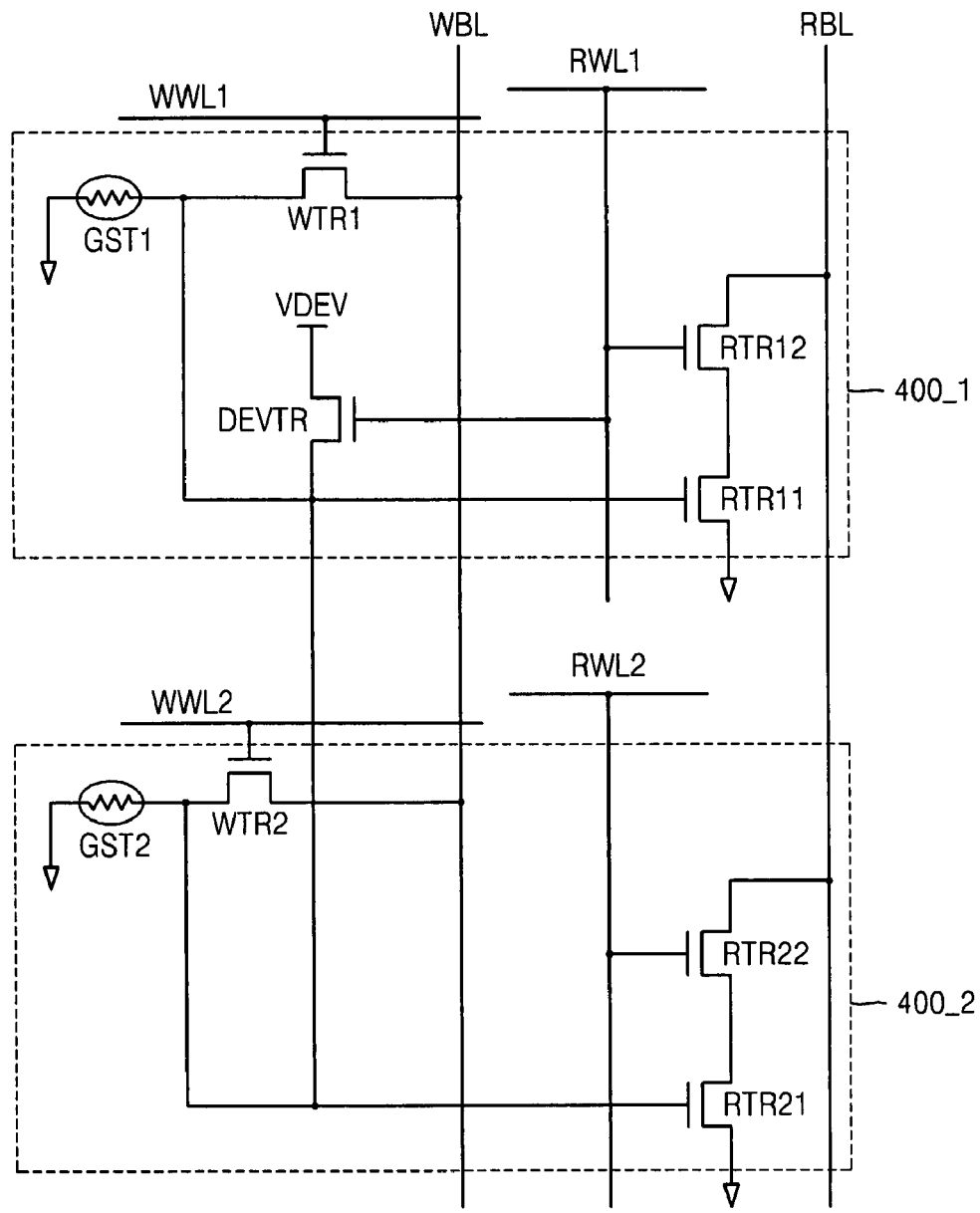
FIG. 4 illustrates a plurality of multi-port PRAM cells that share a developer according to a third embodiment.

FIG. 4 illustrates a plurality of multi-port PRAM cells 400_1 and 400_2 that share a common developer DEVTR according to a third embodiment.

Referring to FIG. 4, the developer DEVTR of the multi-port PRAM cell 400_1 may be shared between the multi-port PRAM cell 400_2 and the multi-port PRAM cell 400_1. The multi-port PRAM cells 400_1 and 400_2 may be included in a same PRAM cell array. The developer DEVTR may provide the developing current IDEV to the multi-port PRAM cells 400_1 and 400_2. In this embodiment, only the multi-port PRAM cell 400_1 may include the developer DEVTR, and the multi-port PRAM cell 400_2 may not include a separate developer, which may allow the area of the PRAM cell array to be reduced.

FIG. 4 illustrates two multi-port PRAM cells 400_1 and 400_2 sharing one developer DEVTR. However, it will be appreciated that the number of multi-port PRAM cells that share one developer DEVTR is not restricted to the illustrated implementation, and two or more multi-port PRAM cells may share one developer DEVTR.

Figure 5:
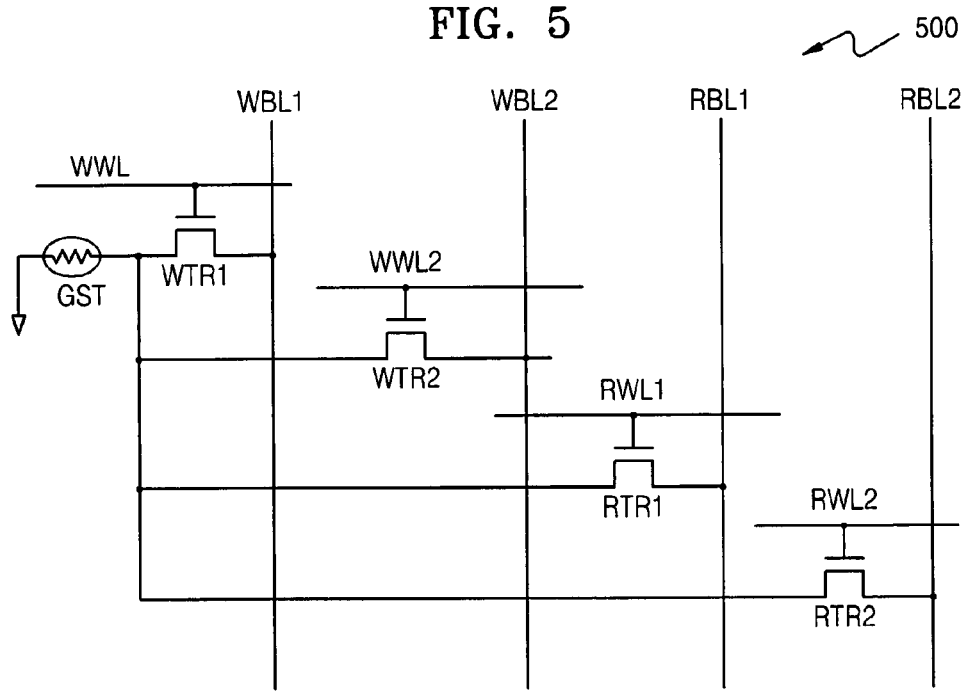
FIG. 5 illustrates a multi-port PRAM cell according to a fourth embodiment.

FIG. 5 illustrates a multi-port PRAM cell 500 according to a fourth embodiment.

Referring to FIG. 5, the multi-port PRAM cell 500 according to the fourth embodiment may include the PRAM element GST including the phase change material, a first writing controller WRT1 and a second writing controller WTR2, and a first reading controller RTR1 and a second reading controller RTR2. Thus, the multi-port PRAM cell 500 may include two data reading routes and data writing routes. The configuration and operation of the multi-port PRAM cell 500 according to the fourth embodiment may otherwise correspond to that of the multi-port PRAM cell 200 according to the first embodiment described above.

Figure 6:
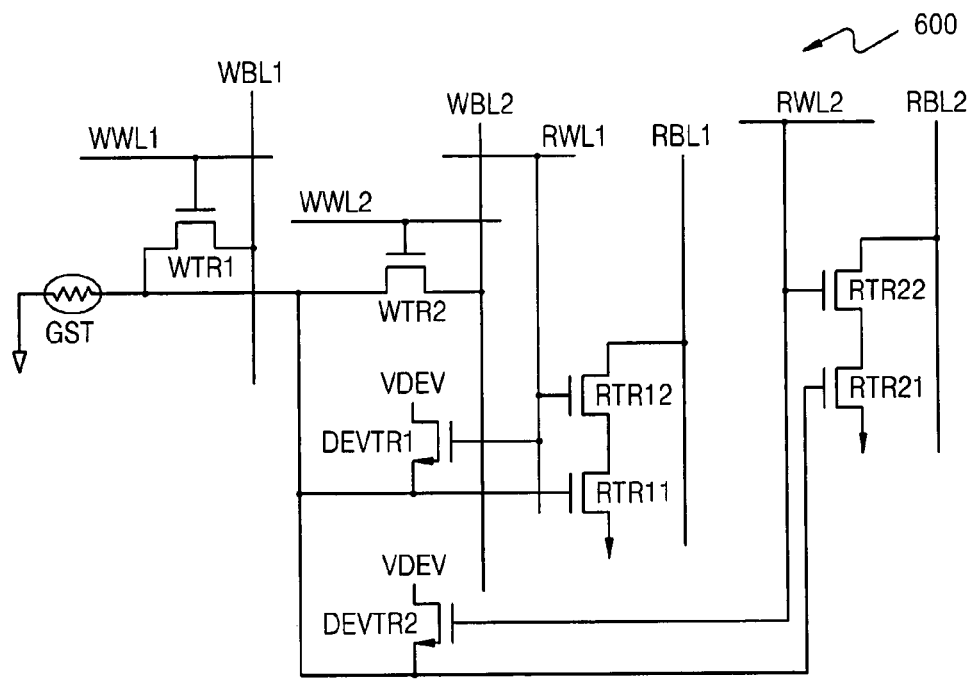
FIG. 6 illustrates a multi-port PRAM cell according to a fifth embodiment.

FIG. 6 illustrates a multi-port PRAM cell 600 according to a fifth embodiment.

Referring to FIG. 6, the multi-port PRAM cell 600 according to the fifth embodiment may include the PRAM element GST including the phase change material, the first writing controller WRT1 and the second writing controller WTR2, the first reading controller RTR1 and the second reading controller RTR2, and a first developer DEVTR1 and a second developer DEVTR2. Thus, the multi-port PRAM cell 600 may include a plurality of developers. The configuration and operation of the multi-port PRAM cell 600 according to the fifth embodiment may otherwise correspond to that of the multi-port PRAM cell 200 according to the first embodiment described above.

Figure 7A:
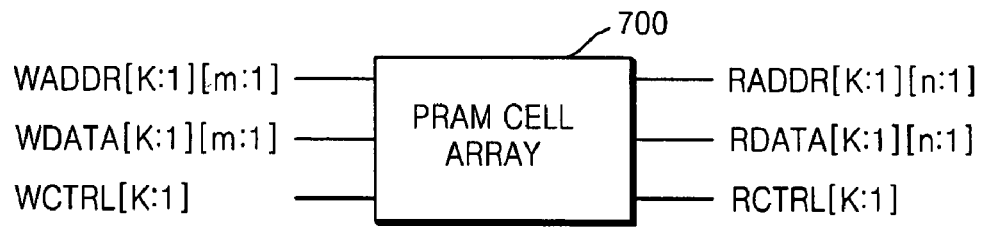
FIG. 7A and FIG. 7B illustrate schematic views of a multi-port PRAM device according to an embodiment.
Figure 7B:
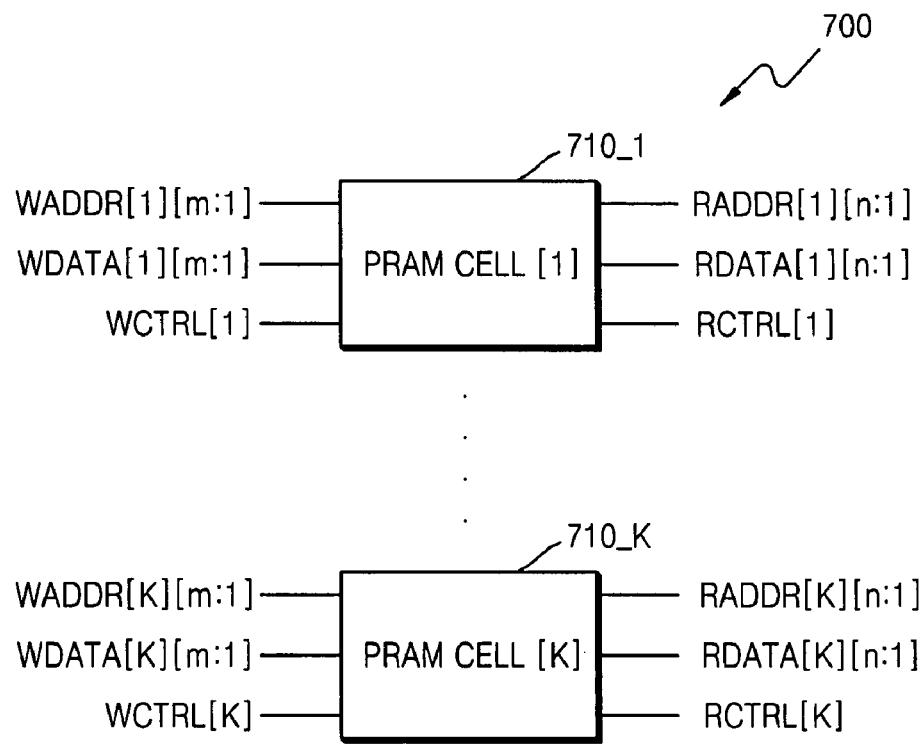

FIG. 7A and FIG. 7B illustrate schematic views of a multi-port PRAM device 700 according to an embodiment.

Referring to FIGS. 7A and 7B, the multi-port PRAM device 700 may include k PRAM cells 710_1 through 710_k, where k is a natural number. Each of the k PRAM cells 710_1 through 710_k may receive m writing addresses WADDR, m writing data signals WDATA, and a respective writing control signal WCTRL, where m is a natural number. Also, each of the k PRAM cells 710_1 through 710_k may receive n reading addresses RADDR, n reading data signals RDATA, and a respective reading control signal RCTRL, where n is a natural number.

Figure 8:
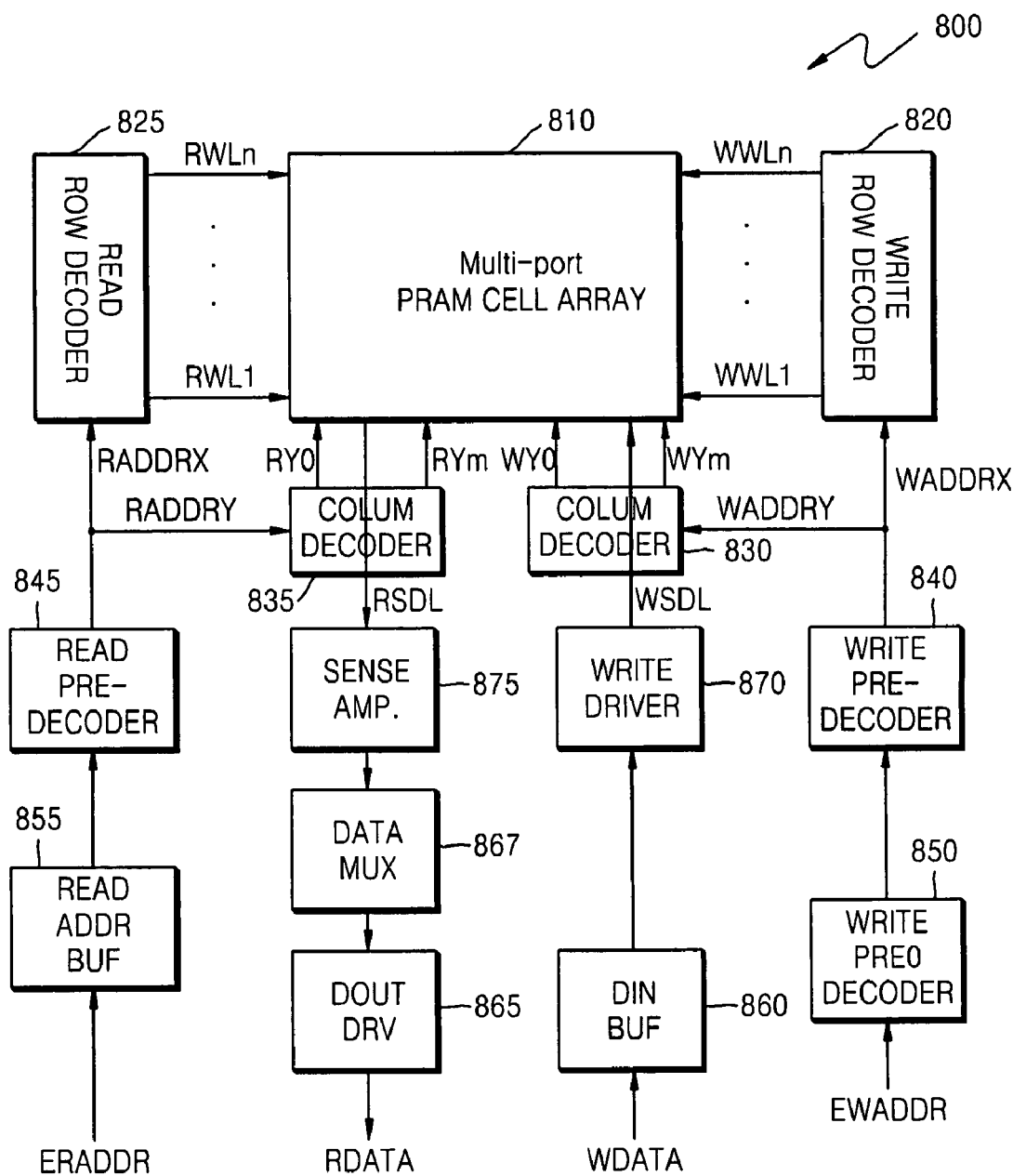
FIG. 8 illustrates a block diagram of a multi-port PRAM device according to an embodiment.

FIG. 8 illustrates a block diagram of a multi-port PRAM device 800 according to an embodiment.

Referring to FIG. 8, the multi-port PRAM device 800 may include a multi-port PRAM cell array 810, data writing units 820, 840, 850, 860, and 870, and data reading units 825, 845, 855, 865, 867, and 876.

The multi-port PRAM cell array 810 may include a plurality of the above-described multi-port PRAM cells according to one or more embodiments. The data writing units may include a write row decoder 820, a write pre-decoder 840, a write pre-decoder 850, a DIN buffer 860, and a write driver 870, which may write data to the multi-port PRAM cell array 810. The data reading units may include a read row decoder 825, a read pre-decoder 845, a read address buffer 855, a Dout driver 865, a data multiplexer 867, and a sense amp 875, which may read data from the multi-port PRAM cell array 810.

As described above, a multi-port memory cell and a multi-port memory device according to embodiments may be formed using PRAM element, which may allow the size of the resultant multi-port PRAM cell to be smaller than that of a multi-port memory cell formed using DRAM. Also, an operational speed of the multi-port PRAM cell according to embodiments may be improved as compared to that of a multi-port memory cell formed using SRAM.

In addition, since the multi-port PRAM cell and the multi-port PRAM device according to the above-described embodiments may separately include a writing port and a reading port, even where the PRAM element has a slower writing speed than a reading speed, it can be optimally driven.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A multi-port phase change random access memory (PRAM) cell, comprising:
    a PRAM element including a phase change material;
    a writing controller configured to operate in correspondence with a writing word line, the writing controller connecting a writing bit line to the PRAM element; and
    a reading controller configured to operate in correspondence with a reading word line, the reading controller connecting the PRAM element to a reading bit line.

2. The multi-port PRAM cell as claimed in claim 1, wherein:
    the multi-port PRAM cell operates in a writing mode, during which data is written to the PRAM element, and a reading mode, during which data is read from the PRAM element,
    the writing controller provides a writing current to the PRAM element in the writing mode, and
    the reading controller provides a reading current to the PRAM element in a reading mode.

3. The multi-port PRAM cell as claimed in claim 1, wherein:
    the writing controller includes a writing access transistor, the writing access transistor having a gate connected to the writing word line, a first terminal connected to the writing bit line, and a second terminal connected to the PRAM element, and
    the reading controller includes a reading access transistor, the reading access transistor having a gate connected to the reading word line, a first terminal connected to the reading bit line, and a second terminal connected to the PRAM element.

4. The multi-port PRAM cell as claimed in claim 1, wherein:
    the multi-port PRAM cell includes a plurality of writing controllers and a plurality of reading controllers,
    the writing controllers connect respective writing bit lines to the PRAM element, the writing controllers being configured to operate in correspondence with respective writing word lines, and
    the reading controllers connect the PRAM element to respective reading bit lines, the reading controllers being configured to operate in correspondence with respective reading word lines.

5. The multi-port PRAM cell as claimed in claim 4, further comprising a plurality of developers, the developers being configured to provide a developing current to the PRAM element as part of a data read operation.

6. The multi-port PRAM cell as claimed in claim 5, wherein the developers are configured to operate in correspondence with respective reading word lines.

7. The multi-port PRAM cell as claimed in claim 6, wherein each developer includes a developing transistor having a gate connected to a respective reading word line.

8. The multi-port PRAM cell as claimed in claim 7, wherein:
    each developing transistor has a predetermined turn-on resistance,
    the predetermined turn-on resistance is greater than the minimum resistance of the PRAM element, and
    the predetermined turn-on resistance is less than the maximum resistance of the PRAM element.

9. The multi-port PRAM cell as claimed in claim 5, wherein each developer provides a developing current that is greater than a minimum current required to read data from the PRAM element and less than a current that affects a crystallization state of the PRAM element.

10. The multi-port PRAM cell as claimed in claim 5, wherein at least one developer also provides the developing current to an adjacent multi-port PRAM cell.

11. The multi-port PRAM cell as claimed in claim 4, wherein:
    the multi-port PRAM cell operates in a writing mode, during which data is written to the PRAM element, and a reading mode, during which data is read from the PRAM element,
    at least one writing controller provides a writing current to the PRAM element in the writing mode, and
    at least one reading controller provides a reading current to the PRAM element in a reading mode.

12. The multi-port PRAM cell as claimed in claim 4, wherein:
    each writing controller includes a writing access transistor, the writing access transistor having a gate connected to a respective writing word line, a first terminal connected to a respective writing bit line, and a second terminal connected to the PRAM element, and
    each reading controller includes a reading access transistor, the reading access transistor having a gate connected to a respective reading word line, a first terminal connected to a respective reading bit line, and a second terminal connected to the PRAM element.

13. A multi-port phase change random access memory (PRAM) cell, comprising:
a PRAM element including a phase change material;
a reading controller configured to operate in correspondence with a reading word line, the reading controller connecting the PRAM element to a reading bit line; and
a developer configured to provide a developing current to the PRAM element as part of a data read operation.

14. The multi-port PRAM cell as claimed in claim 13, wherein the developer is configured to operate in correspondence with the reading word line.

15. The multi-port PRAM cell as claimed in claim 14, wherein the developer includes a developing transistor having a gate connected to the reading word line.

16. The multi-port PRAM cell as claimed in claim 15, wherein:
the developing transistor has a predetermined turn-on resistance,
the predetermined turn-on resistance is greater than the minimum resistance of the PRAM element, and
the predetermined turn-on resistance is less than the maximum resistance of the PRAM element.

17. The multi-port PRAM cell as claimed in claim 13, wherein the developer provides a developing current that is greater than a minimum current required to read data from the PRAM element and less than a current that affects a crystallization state of the PRAM element.

18. The multi-port PRAM cell as claimed in claim 13, wherein the developer also provides the developing current to at least one other multi-port PRAM cell.

19. A phase change random access memory (PRAM) device, comprising:
a plurality of multi-port PRAM cells;
a data writing unit connected to the plurality of multi-port PRAM cells and configured to write data to the multi-port PRAM cells; and
a data reading unit connected to the plurality of multi-port PRAM cells and configured to read data from the multi-port PRAM cells, wherein each PRAM cell includes:
a PRAM element including a phase change material;
a writing controller configured to operate in correspondence with a writing word line, the writing controller connecting a writing bit line to the PRAM element; and
a reading controller configured to operate in correspondence with a reading word line, the reading controller connecting the PRAM element to a reading bit line.

20. The PRAM device as claimed in claim 19, further comprising at least one developer configured to provide a developing current to one or more of the plurality of PRAM cells as part of a data read operation.

21. The PRAM device as claimed in claim 19, wherein:
the multi-port PRAM cell includes a plurality of writing controllers and a plurality of reading controllers,
the writing controllers connect respective writing bit lines to the PRAM element, the writing controllers being configured to operate in correspondence with respective writing word lines, and
the reading controllers connect the PRAM element to respective reading bit lines, the reading controllers being configured to operate in correspondence with respective reading word lines.

22. A method for operating a multi-port phase change random access memory (PRAM) device, the method comprising:
receiving a write command through a first port;
receiving a write data through the first port;
storing the write data in a multi-port PRAM cell using a phase change material;
reading a read data from the multi-port PRAM cell; and
transmitting the read data through a second port.

23. The method as claimed in claim 22, wherein:
the first port includes a writing controller controlled by a writing word line,
the second port includes a reading controller controlled by a reading word line,
storing the write data in a multi-port PRAM cell includes connecting a writing bit line to a PRAM element that includes the phase change material, the connecting of the writing bit line being controlled by the writing controller, and
reading the read data from the multi-port PRAM cell includes connecting the PRAM element to a reading bit line, the connecting of the reading bit line being controlled by the reading controller.

24. The method as claimed in claim 23, wherein:
the multi-port PRAM device further includes a developer configured to provide a developing current to the multi-port PRAM cell when reading the read data from the multi-port PRAM cell, and
reading the read data from the multi-port PRAM cell further includes controlling the developer using the reading word line.

* * * * *